United States Patent
Flaim et al.

(10) Patent No.: US 6,303,270 B1
(45) Date of Patent: Oct. 16, 2001

(54) HIGHLY PLASMA ETCH-RESISTANT PHOTORESIST COMPOSITION CONTAINING A PHOTOSENSITIVE POLYMERIC TITANIA PRECURSOR

(75) Inventors: Tony D. Flaim, St. James; Douglas J. Guerrero, Rolla; Michelle R. Fowler, Salem; William J. James, Rolla; Vladimir Petrovsky, Rolla; Harlan U. Anderson, Rolla, all of MO (US)

(73) Assignees: The Curators of the University of Missouri; Brewer Science, Inc, both of Rolla, MO (US)

( * ) Notice: Subject to any disclaimer, the term of this patent is extended or adjusted under 35 U.S.C. 154(b) by 0 days.

(21) Appl. No.: 09/259,229

(22) Filed: Mar. 1, 1999

(51) Int. Cl.$^7$ ............................. G03F 7/028; G03F 7/038; G03F 7/09; C08G 67/00; C08G 79/00

(52) U.S. Cl. ..................................... 430/284.1; 430/287.1; 430/285.1; 430/311; 525/389; 528/220; 528/395

(58) Field of Search ............................. 430/287.1, 285.1, 430/284.1, 311; 525/389; 528/220, 395

(56) References Cited

U.S. PATENT DOCUMENTS

| | | | |
|---|---|---|---|
| 5,250,395 | 10/1993 | Allen et al. | 430/270.1 |
| 5,254,638 | * 10/1993 | Novak et al. | 525/389 |
| 5,328,975 | * 7/1994 | Hanson et al. | 528/29 |
| 5,627,013 | * 5/1997 | Kamisawa | 430/325 |
| 5,756,628 | * 5/1998 | Tani et al. | 528/9 |

OTHER PUBLICATIONS

Young, S.E., The Curing of Organic Coatings by High Energy Radiation Processes, Progress in Organic, 4 (1976) pp. 225–249.*

Monroe, B, et al, Photoinitiatiors for Free–Radical–Initiated Photoimaging Systems, Chem. Rev. 1993, pp. 435–448.*

F. Coopmans and B. Roland, Proceedings of the SPIE, vol. 631, p. 34 (1986).

Dupont® Performance Chemicals Technical Information sheet; TYZOR® organic titanates; unknown.

Dupont® Performance Chemicals Technical Information sheet; TYZOR® BTP; Feb. 28, 1998.

* cited by examiner

*Primary Examiner*—Cynthia Hamilton
(74) *Attorney, Agent, or Firm*—Hovey, Williams, Timmons & Collins

(57) ABSTRACT

A composition is derived from an addition polymerizable organotitanium polymer which upon exposure to an oxygen plasma or baking in air, is converted to titanium dioxide (titania) or is converted to a mixed, titanium-containing metal oxide. The metal oxide formed in situ imparts etch-resistant action to a patterned photoresist layer. The composition may also be directly deposited and patterned into permanent metal oxide device features by a photolithographic process.

48 Claims, 4 Drawing Sheets

TABLE 1
VARIATION OF PHOTORESIST PLASMA ETCHING RESISTANCE WITH BAKING CONDITIONS

| BAKE PROCESS* | PLASMA ETCH PROCESS ** | PLASMA ETCH TIME (MIN) | PRE-ETCH FILM THICKNESS (Å) | POST-ETCH FIL THICKNESS (Å) | LOSS (Å) |
|---|---|---|---|---|---|
| 120° C ON HOTPLATE FOR 2 MIN. | NONE | NA | 1531 | | |
| 175° C ON HOTPLATE FOR 5 MIN | NONE | NA | 983 | | |
| 200° C IN OVEN FOR 1 HR | | | | | |
| 120° C ON HOTPLATE FOR 2 MIN. | $O_2$ | 5 | 1531 | 1491 | 40 |
| 120° C ON HOTPLATE FOR 2 MIN. | $O_2/CF_4$ | 2 | 1495 | 1170 | 325 |
| 120° C ON HOTPLATE FOR 2 MIN. | $O_2/CF_4$ | 4 | 1495 | 0 | 1495 |

FIG. 3

TABLE 1 (CONT.)

| | | | | |
|---|---|---|---|---|
| 175° C ON HOTPLATE FOR 5 MIN. | $O_2$ | 5 | 983 | 898 | 85 |
| 175° C ON HOTPLATE FOR 5 MIN. | $O_2/CF_4$ | 2 | 983 | 747 | 236 |
| 175° C ON HOTPLATE FOR 5 MIN | $O_2/CF_4$ | 4 | 983 | 371 | 612 |
| 200° C IN OVEN FOR 1 HR. | $O_2$ | 5 | 583 | 535 | 48 |
| 200° C IN OVEN FOR 1 HR. | $O_2/CF_4$ | 2 | 583 | 334 | 249 |
| 200° C IN OVEN FOR 1 HR. | $O_2/CF_4$ | 4 | 583 | 131 | 452 |

\* SPECIMENS BACKED AT 175° C AND 200° C PREVIOUSLY RECEIVED A TWO-MINUTE BAKE ON A HOT PLATE AT 120° C TO REMOVE SOLVENTS FOR THE PHOTORESIST LAYER.

\*\* GAS PRESSURE = 2 TORR; POWER = 250 WATTS

FIG. 4

HIGHLY PLASMA ETCH-RESISTANT PHOTORESIST COMPOSITION CONTAINING A PHOTOSENSITIVE POLYMERIC TITANIA PRECURSOR

TECHNICAL FIELD

This invention relates to light-sensitive compositions useful for defining patterns on substrates by photolithography, particularly to new photoresist compositions especially useful in microlithographic applications where it is desirable to form microscopically-sized patterns which exhibit exceptional resistance to plasma etching. The present invention also relates to precursor compositions used to form the photoresist compositions and methods for forming, the precursor compositions and the photoresist compositions.

BACKGROUND OF THE INVENTION

Semiconductor devices such as integrated circuits, solid state sensors and flat panel displays are produced by microlithographic processes in which a photoresist is used to form a desired feature pattern on a device substrate. Light is passed through a patterned mask onto the photoresist layer which has been coated onto the device substrate. A chemical change occurs in the light-struck areas of the photoresist, causing the affected regions to become either more soluble or less soluble in a chemical developer. Treating the exposed photoresist with the developer etches a positive or negative image, respectively, into the photoresist layer. The resulting pattern serves as a contact mask for selectively modifying those regions of the substrate which are not protected by the pattern. These modifications may include, for example, etching, ion implantation, and deposition of a dissimilar material.

Plasma etching processes are being used increasingly to transfer photoresist patterns into device substrates or underlying layers. It is important that the photoresist pattern does not erode excessively during the plasma etching process, otherwise, the precise pattern will not be transferred into the underlying layer. For example, if the photoresist is removed by the etching process before the underlying layer has been fully etched, then the feature size will begin to increase as the etching process proceeds since the photoresist is no longer protecting the area of the substrate which it once covered. Because of the precision required in etching this is disadvantageous.

Plasma etching processes for organic layers such as color filters used in solid state color sensors and flat panel displays require photoresist materials with exceptional resistance to oxygen plasma etching. Conventional photoresists cannot be used effectively since they are primarily mixtures of organic compounds and resins which are etched more rapidly than the color layers.

Silicon-containing photoresists and silylated photoresist products have been developed to provide greater etch selectivity when patterning organic layers by oxygen plasma etchinig. Such compositions have been described, for example, in U.S. Pat. No. 5,250,395 issued to Allen et al. and by F. Coopmans and B. Rola in *Proceedings of the SPIE*, Vol. 631, p. 34 (1986). During the etching process, the silicon components in the photoresist are rapidly converted to silicon dioxide which resists further etching. The in-situ formed silicon dioxide layer then becomes the mask for etching the underlying organic layer.

Although oxygen is normally the principal plasma etchant for organic layers, it may be admixed with various fluorinated gases such as $NF_3$, $C_2F_6$, $HCF_3$, and $CF_4$ to aid in the removal of inorganic residues arising from metallic species. The inorganic residues are often present, for example, in color filter layers. Since, silicon dioxide is readily etched by fluorine-containing plasma etchants, silicon-containing photoresists cannot be used effectively in plasma etching processes where fluorine-containing gases are present.

For color filter applications, it is also desirable that the plasma etch-resistant photoresist be left in place as a permanent part of the device structure after the etching process has been completed. To function suitably in this respect, the remaining photoresist material must be continuous, homogeneous, highly adherent, and optically clear so that it does not reduce the transmissivity of the color filter assembly. Silicon-containing photoresists often exhibit poor optical clarity after plasma etching or high temperature thermal treatments which are usually applied to color filter layers. This problem is especially prevalent with silylated phenolic photoresists since the phenolic components form highly colored species when heated to above approximately 125° C.

There are other microlithographic applications where it is also desirable to leave a processed photoresist layer in place as a permanent device structure. For example, thin barium titanate and lead zirconate titanate layers are needed as ferroelectrics in advanced memory devices. Presently, these complex metal oxides must be deposited by chemical vapor deposition and then patterned in separate plasma etching processes. Considerable time and expense could be saved if the materials could be applied in a photosensitive precursor form by spin coating and then directly patterned by a photolithographic process, after which the patterned layer would be calcined in air to form the desired metal oxide device features.

Accordingly, there is a need for a photoresist material with greater plasma etching resistance in processes utilizing oxygen and/or fluorinated gases as the etchant species. At the same time, there is a need for a photoresist which is convertible to a permanent metal oxide layer with chemical, thermal, electrical, and optical properties useful for device application and whose properties can be controlled by adjusting the composition of the photoresist. The photoresist should further possess high resolution patterning capabilities and be easily integrated into modern microlithographic processing schemes. We have now discovered that all of these requirements surprisingly can be met with a photoresist composition containing an addition polymerizable organotitanium polymer as the principal constituent.

BRIEF DESCRIPTION OF THE DRAWINGS

FIG. 3 shows a table which displays a variation of photoresist plasma etching resistance with baking conditions; and, FIG. 4 is a continuation of the table of FIG. 3.

SUMMARY OF THE INVENTION

Figure 1:
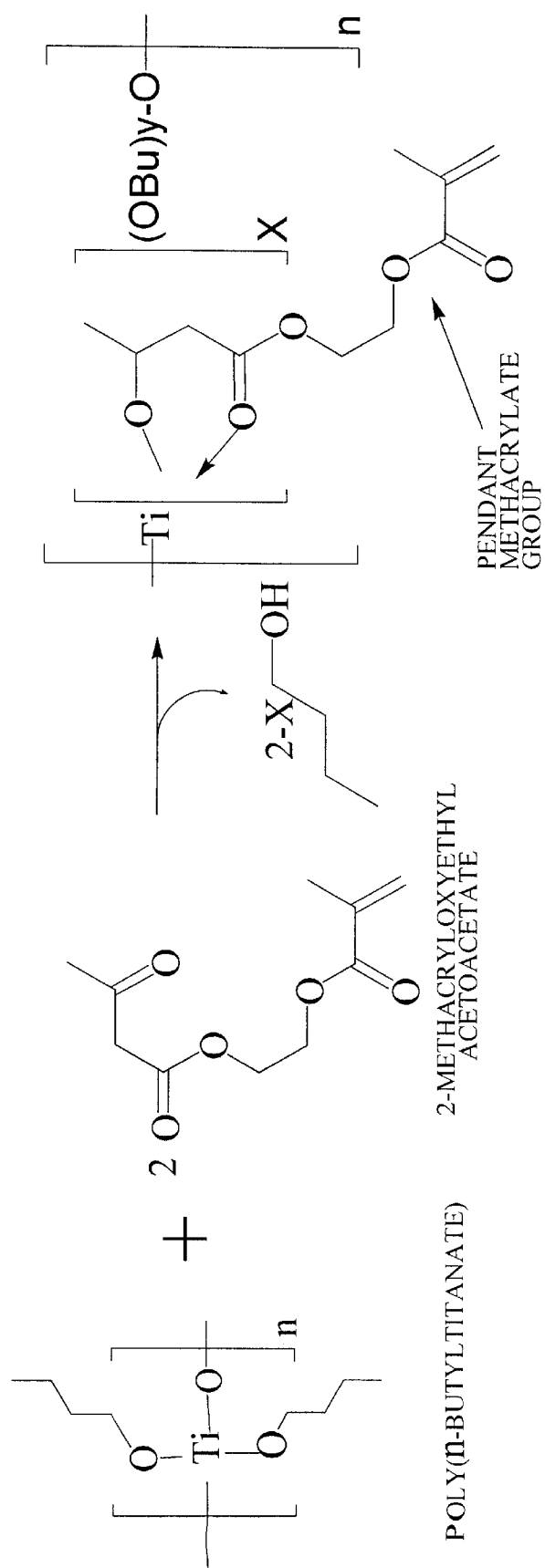
FIG. 1 is a reaction showing the formation of an example organotitanium polymer.

It is a principle object of the present invention to provide a photoresist composition with improved resistance to plasma etching processes which utilize oxygen and/or fluorine-containing gases, as well as noble gases, as the etchant species, with oxygen and fluorine preferred. It is a further objective to provide a photoresist composition which exhibits the following desirable properties in addition to improved plasma etching resistance:

a) good coating quality and feature coverage when applied by spin coating onto electronic substrates;
b) high sensitivity to ultraviolet, electron beam, and x-ray exposing radiation;
c) facile image development in aqueous alkaline developers;
d) good pre-cure adhesion to polymer, metal, and semiconductor materials;
e) high resolution, i.e., feature sizes of approximately 1 micron or smaller should be readily obtainable; and,
f) curable to a continuous, homogeneous, and, if desired, optically clear (>90% transmissivity at 400–700 nm wavelengths for 0.25 micron film thickness) metal oxide layer having good adhesion to underlying device structures.

Lastly, it is an objective of this invention to provide a method for using the photoresist composition in a microlithographic process as a plasma etch-resistant masking layer or a permanent device structure.

The improved photoresist composition is comprised principally of: a) an addition polymerizable organotitanium polymer or copolymer, b) a photopolymerization initiator or initiator system, and c) a solvent vehicle.

The photoresist composition is preferably coated onto a substrate by any of a variety of means, with spin coating preferred, and then dried to obtain a uniform, defect-free layer, which is then exposed to ultraviolet radiation through a patterned mask to generate a latent image. The exposed photoresist is etched in an alkaline aqueous solution or an aqueous chelate solution. having a pH greater than 10, to leave a negative-tone image of the mask in the layer. The patterned structure is baked in air and/or exposed to an oxygen-containing plasma to partially or fully convert the photoresist material into a titanium-containing metal oxide layer with high plasma etching resistance. The resulting metal oxide layer may be used as a mask for modifying underlying, layers by plasma etching, implantation, deposition, or other processes. Depending on its final physical and chemical properties, it may be left in place as a permanent device structure after the processing sequence has been completed.

DETAILED DESCRIPTION OF THE INVENTION

The improved photoresist composition of the present invention is preferably comprised of:

a) an addition polymerizable organotitanium polymer or copolymer prepared by reacting a poly(alkyltitanate) or poly(alkyltitanate-co-alkylmetallate) with an alcohol, carboxylic acid, beta-diketone, beta-ketoester, or alpha-hydroxy carboxylic acid, acid salt, or ester having at least one ethylenically unsaturated double bond capable of addition polymerization, wherein the copolymerized alkylmetallate moiety is selected from the group consisting of —(RO)Al—O—, —(RO)$_2$Zr—O—, —(R')$_2$Si—O—, —(R')(RO)Si—O—, and —(RO)$_2$Si—O—, and where R and R' are monovalent organic radicals;
b) a free radical-generating, photopolymerization initiator or initiator system;
c) a solvent vehicle suitable for obtaining high quality thin films on device substrates by spin casting.

The composition may additionally contain one or both of the following constituents:

d) an addition polymerizable co-monomer having at least one ethylenically unsaturated double bond, wherein the co-monomer may contain a covalently bonded metal; and,
e) a soluble metallic compound which is stable in the presence of the other photoresist ingredients.

It will be apparent to those skilled in the art that the organotitanium polymer or copolymer used in the title invention, and which upon heat treatment forms a metal oxide composition, is inherently capable of addition polymerization by virtue of the ethylenically unsaturated double bonds present within its structure. Therefore, it is expected that the organotitanium polymer or copolymer could be used alone in solution or in combination with some, but not necessarily all, of the above-mentioned constituents to prepare coatings which can be patterned by selective exposure to ionizing radiation, assuming such radiation is capable of inducing addition polymerization in the coating. For example, the improved photoresist composition may be exposed to an electron beam or x-ray source to form a negative-tone image in a manner analogous to exposure to ultraviolet light. In such instances, the inclusion of a free radical-generating photopolymerization initiator or initiator system may not be necessary for patterning since the high energy radiation can induce crosslinking in the exposed areas of the coating.

Components Of Composition a. Addition Polymerizable Organotitanium Polymer

Organotitanium polymers suitable for use in the new photoresist composition include the reaction products of poly(alkyltitanates) and poly(alkyltitanates-co-alkylmetallates) with addition polymerizable alcohols, carboxylic acids, beta-diketones, beta-ketoesters, and alpha-hydroxy carboxylic acids, acid salts, and esters. For example, poly(n-butyl titanate) can be reacted with 2-hydroxyethyl acrylate to form the following polymeric titanate ester (1) which is capable of addition polymerization:

$$—[Ti(OR_a)_x(OBu)_y—O]_n—  \qquad (1)$$

where $R_a$=—CH$_2$—CH$_2$—O—CO—CA=CH$_2$, Bu=—CH$_2$—CH$_2$CH$_2$—CH$_3$, x+y=2, x=0.1–2.0, A=—H or —CH$_3$, and n>2.

Poly(alkyltitanates) can also be reacted with acrylic acid or other addition polymerizable carboxylic acids to produce polymeric titanium acylates useful in the present invention. The reaction of poly(in-butyltitaniate) with acrylic acid, for example, results in the following polymeric product (2) which is capable of addition polymerization:

$$—[Ti(OR_b)_x(OBu)_y—O]_n—  \qquad (2)$$

where $R_b$=—O—CO—CA=CH$_2$, Bu=—CH$_2$—CH$_2$—CH$_2$—CH$_3$, x+y=2, x=0.1–2.0, A=—H or —CH$_3$, and n>2.

Similarly, poly(alkyltitanates) can be reacted with beta-diketones, beta-ketoesters, and alpha-hydroxy carboxylic acids, acid salts, and esters containing addition polymerizable groups to produce polymeric titanium chelates useful in the present invention. For example, the reaction of poly(n-butyltitanate) with 2-acetoacetoxyethyl methacrylate, a beta-ketoester, results in the following, polymeric product (3) which is capable of addition polymerization:

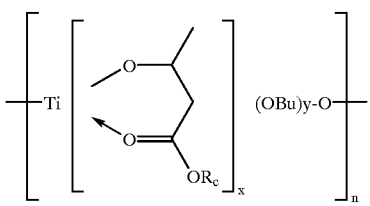

where $R_c = -CH_2-CH_2-O-CO-C(CH_3)=CH_2$
$Bu = -CH_2-CH_2-CH_2-CH_3$, $x+y=2$, $x=0.1-2.0$, and $n>2$.

The reaction of poly(n-butyltitanate) with an addition polymerizable alpha-hydroxy carboxylic acid salt also yields a polymeric titanium chelate (4) useful in the present invention, for example:

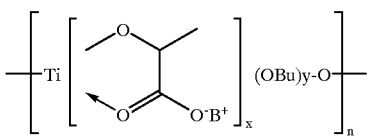

where $B^+ = (H_3C)_2NH^+-R-CO-CA=CH_2$, $R = -CH_2-CH_2-CH_2-NH-$ or $-CH_2-CH_2-O-$, $Bu = -CH_2-CH_2-CH_2-CH_3$, $x+y=2$, $x=0.1-2.0$, $A = -H$ or $-CH_3$, and $n>2$.

An example of how the organotitanium polymer is formed is shown in FIG. 1.

It will be apparent to those skilled in the art that useful addition polymerizable organotitanium polymers can also be prepared by reacting poly(alkyltitanates) with other known titanium chelants which have been functionalized to enable free radical-initiated polymerization. It will be further apparent that functionally equivalent, addition polymerizable organotitanium polymers can be prepared in principle by reacting, for examples titanate orthoesters having at least one ethylenically unsaturated double bond with a limited amount of water to form a soluble polymeric condensation product. Lastly, it is inferred that addition polymerizable organometallic polymers useful for the present invention can be prepared similarly from copolymers of alkyltitanates with alkylsilicates (siloxanes) and other alkylmetallates, notably those of aluminum, zirconium, cerium, niobium, and tantalum.

b. Photopolymerization Initiators or Initiator Systems

All known free radical initiators or initiator systems which operate effectively at 200–500 nm exposing wavelengths can be substantially employed as the photopolymerization initiator or initiator system for the present invention. The free radical initiator decomposes upon exposure to ultraviolet light, forming a species which has an unpaired electron or is capable of extracting a proton from another molecule so that the latter carries an unpaired electron. The free radical thus formed adds readily to an unsaturated double bond, especially acrylate-type double bonds, to generate a new free radical which then reacts with another double bond-containing molecule, and so on, creating a polymer chain in the process. The polymer-forming process is called addition polymerization. Examples of suitable initiators and initiator systems include:

1) trihalomethyl-substituted triazines such as p-methoxy phenyl-2,4-bis(trichloromethyl)-s-triazine;
2) trihalomethyl-substituted oxadiazoles such as 2-(p-butoxy styryl) chloromethyl-1,3,4-oxadiazole;
3) imidazole derivatives such as 2-(2'-chlorophenyl)-4,5-diphenylimidazole dimer (with a proton donor such as mercaptobenzimidazole);
4) hexaaryl biimidazoles such as 2,2'-bis(o-chlorophenyl) 4,4',5,5'-tetraphenylbiimidazole;
5) benzoin alkyl ethers such as benzoin isopropyl ether;
6) anthraquinone derivatives such as 2-ethylanthraquinone;
7) benzanthrones;
8) benzophenones such as Michler's ketone;
9) acetophenones such as 2,2-diethoxy-2-phenylacetophenone;
10) thioxanthones such as 2-isopropylthioxanthone;
11) benzoic acid ester derivatives such as octyl p-dimethyl aminobenzoate;
12) acridines such as 9-phenylacridine;
13) phenazines such as 9,10-dimethylbenzphenazine; and,
14) titanium derivatives such as bis(cyclopentadienyl)-bis (2,6-difluoro-3-(pyl-1-yl) titanium.

These photopolymerization initiators may be used alone or in admixture. An example would be combining 2-isopropylthioxanthone with octyl p-dimethylaminobenzoate.

c. Solvent Vehicle and Additives

Suitable solvents for the new photoresist composition include alcohols, esters, glymes, ethers, glycol ether, ketones and their admixtures which boil in the range 70°–180° C. Especially preferred solvents include 1-methoxy-2-propanol (PGME), 2-butoxyethanol, cyclohexanone, 2-heptanone, ethyl 3-ethoxypropionate, propylene glycol methyl ether acetate, and other common photoresist solvents. Solvent systems containing an alcohol, such as PGME, are preferred for obtaining improved hydrolytic stability of the photoresist composition. Solvents such as ethyl acetoacetate and ethyl lactate may be used in the photoresist composition provided they do not cause side reactions with the photosensitive organotitanium polymer.

The photoresist composition may be augmented with small amounts (up to 20 wt. % of total solvents) of high boiling solvents such as N-methylpyrrolidone, gamma-butyrolactone, and tetrahydrofurfuryl alcohol to improve the solubility of the coating components, provided the solvents do not cause coating quality problems. Surface tension modifiers such as 3M Company's FLUORADO® FC-171 or FC-430 fluorinated surfactants may be added at low levels (approximately 1000 parts per million) to optimize coating quality without affecting the lithographic properties of the photoresist.

d. Co-monomers

Co-monomers having at least one ethylenically unsaturated double bond capable of addition polymerization may be added to the photoresist composition to improve the photospeed, resolution, or physical and chemical properties of the photoresist layer. Preferred comonomers carry multiple acrylate groups which participate in the addition polymerization process described above in the initiation and initiator systems. From the standpoint of the polymerization, co-monomers are indistinguishable from the (meth)acrylate groups on the organotitanium polymer. The comonomer can serve many purposes for example: 1) it can modify film properties from what would be obtained with the organotitanium polymer only, e.g., it can make the product softer or harder, 2) it can increased the photospeed by providing a higher concentration of polymerizable groups in the coating, or 3) it can change the development properties of the coating by making it more or less soluble in basic developer. Examples of suitable comonomers include mono- and polyfunctional (meth)acrylate esters such as 2-hydroxyethyl (meth)acrylate; ethylene glycol dimethacrylate, pentaerythritol triacrylate, and tetraacrylate; dipentaerythritol pentaacrylate and hexaacrylate; polyester (meth)acrylates obtained by reacting (meth)acrylic acid with polyester prepolymers; urethane (meth)acrylates; epoxy (meth)acrylates prepared by reacting (meth)acrylic acid with epoxy resins such as bisphenol-A type epoxy resins, bisphenol-F type epoxy resins, and novolak-type epoxy resins; and, tris(2-acryloyloxyethyl) isocyanurate.

Suitable co-monomers also include acrylic-functional metal complexes prepared, for example, by tranesterifying titanium or zirconium alkoxides with 2-hydroxyethyl acrylate or a chelating organic moiety. The use of such metal-containing, co-monomers is advantageous for maintaining high metal content in the photoresist composition.

e. Non-Photopolymerizable Metallic Compounds

Non-photopolymerizable metallic compounds may be added to the photoresist composition to increase metal content or obtain complex metal oxide compositions from the processed photoresist layer. Suitable compounds include soluble metal carboxylates, metal alkoxides, metal hydroxides, metal chelates, and simple metal salts such as metal chlorides or nitrates. The amount and type of metal compounds which can be added are governed by 1) their solubility in the liquid photoresist as well as in the dried photoresist layer (an added metal compound should not crystallize in the dried film); 2) their overall effect on the lithographic properties of the photoresist; and, 3) their reactivity with the other photoresist components. It is especially important that added metal compounds do not cause precipitation of the organotitanium polymer or reduce its polymerizability through unwanted side reactions.

f. Other Compounds

Non-reactive organic compounds may be added to the photoresist composition to modify the properties of the photoresist layer. For example, solvent-soluble dyes can be added to the composition to prepare a patternable, permanently colored layer for light-filtering applications. Pigments can also be dispersed in the photoresist to obtain a directly patternable colored product. The ability to add these materials depends on their compatibility with the other photoresist components and their impact on the lithographic properties of the coating.

Method of Preparation a. Preparation of Photopolymerizable Organotitanium Polymer The addition polymerizable organotitanium polymer is preferably prepared by reacting in solution a poly(alkyltitanate) or poly(alkyltitanate-co-alkylmetallate) with a stoichiometric excess of an alcohol, carboxylic acid, beta-diketone, beta-ketoester, or alpha-hydroxy carboxylic acid, acid salt, or ester having at least one ethylenically unsaturated double bond capable of addition polymerization. The ester substituents on the starting polymer are substituted by the polymerizable reactants to form the final photosensitive product. The solution may be heated to about 70° C. for several hours to increase the rate and yield of the substitution reaction. By-product alcohol may be removed continuously from the reactor by vacuum distillation to drive the reaction to completion.

b. Formulation of Photoresist

The addition polymerizable organotitanium polymer, photopolymerization initiator(s), and, if present, co-monomers, and non-photopolymerizable metallic and organic compounds are combined by stirring in a portion of the solvent system and then diluted with additional portions of the solvent system until the desired total solids level is obtained. A total solids level of 30 wt. % is typically required in the solution to achieve a film thickness of 500–2500 Å when it is spin coated at 1000–5000 rpm for 30–90 seconds and then dried at approximately 100° C. Prior to the final dilution, the photoresist solution or its components may be treated, for example, by ion exchange processes to remove metal ion contamination. Preferred compositional ranges (expressed in wt. % based on total solids content) for each of the photoresist components are summarized in the table below:

| Component | Useful Range % | Preferred Range % |
|---|---|---|
| addition polmerizable organotitanium polymer or copolymer | 15–90 | 40–80 |
| photoinitiator or photoinitiator system | 1–20 | 10–15 |
| co-monomers | 0–80 | 0–50 |
| non-photopolymerizable metallic and organic compounds or pigments | 0–60 | 0–40 |

Method of Use

The improved photoresist composition can be used effectively on most ceramic, metal, polymer, and semiconductor substrates including, for example, glass, sapphire, aluminum nitride, crystalline and polycrystalline silicon, silicon dioxide, silicon (oxy)nitride, aluminum, aluminum/silicon alloys, copper, platinum, tungsten, and organic layers such as color filters and polyimide coatings. The photoresist is coated onto the substrate by any of a variety of means including spin coating, roller coating, blade coating, meniscus or slot coating, and spray coating. Spin coatings, however, is most preferred with the photoresist applied by spin coating at 500–5000 rpm for 30–90 seconds. Spinning speeds of 1000–4000 rpm are especially preferred for obtaining uniform, defect-free coatings on 6" and 8" semiconductor substrates. The spin-coated film is dried typically at 80–120° C. for 30–120 seconds on a hot plate or equivalent baking unit prior to exposure. The photoresist is preferably applied at a film thickness of 0.05–1.00 micron (as-spun) and, more typically, to a film thickness of 0.10–0.50 micron by adjusting both the total solids level of the photoresist and the spinning speed and time to give the desired layer thickness. While the before mentioned thicknesses are preferred, the photoresists can be applied to a thickness of several microns if desired, assuming a sufficient level of polymer solids can be supported in the photoresist solution. Film thickness can be increased by increasing solids content, reducing the spinning speed, and formulating the resist with faster-drying solvents.

Figure 2:
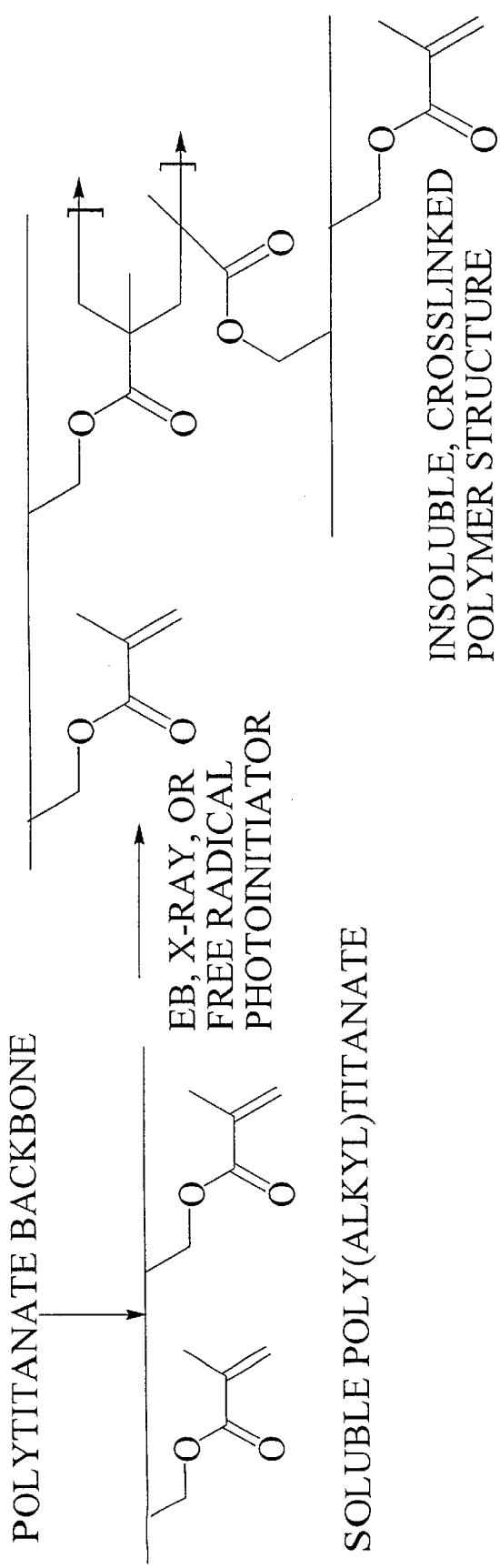
FIG. 2 shows the crosslinking reaction that occurs when the polymer is applied onto the substrate and exposed to radiation which induces addition polymerization.

A latent image is formed in the photoresist layer by exposing it to ultraviolet radiation through a mask. An exposure dose of 10–1000 mJ/cm$^2$ is typically applied to the photoresist to define the latent image. Alternatively, regions of the photoresist layer may be exposed to electron beam or x-ray radiation to form a latent negative-tone image. An example of the radiation-induced crosslinking reation that occurs in the exposed areas is shown in FIG. 2. The exposed photoresist layer is developed in aqueous alkali or an aqueous chelant solution to form the final pattern.

For use as a plasma etching mask, the patterned photoresist is converted to an etch-resistant metal oxide layer by one of two techniques. In the first, it is baked in air at 150°–300° C. for 15–60 minutes to decompose the organic components and leave a predominantly inorganic layer which is etch-resistant. The processed photoresist layer can then be used as a mask for plasma etching an underlying layer with oxygen or a fluorinated gas species.

In the second method, the patterned photoresist is applied and patterned over an organic layer such as a color filter. The two-layer structure is placed directly in a plasma etching environment where oxygen is the principal etching species. (Prior thermal decomposition is not required). The photoresist layer is partially converted to a metal oxide film during the initial portion of the process and then serves as an etching mask for the organic layer.

It is becoming popular to planarize surface topography during( the construction of integrated circuits in order to reduce photoresist thickness variations across the substrate and thereby enhance feature size control. In such instances, a relatively thick organic layer may be applied over the device features to form a planar surface. A thin photoresist is then applied onto the structure and used to pattern the organic planarizing layer by oxygen plasma etching. The remaining photoresist and the planarizing layer form a composite mask, or bilayer photoresist system, for etching or otherwise modifying the substrate. The new photoresist can be used very effectively in such processes because of its combined resistance to oxygen- and fluorinie-containing plasma etching processes. The use of the new photoresist in a bilayer configuration essentially follows the process described above for patterning an organic color filter. After the planarizing layer has been cleared by oxygen plasma etching, a fluorinated etchant may be introduced to etch the substrate. Unlike silicon-containing, bilayer photoresists which erode under these conditions, the new photoresist shows less degradation, which helps to maintain better edge acuity on the photoresist features throughout the etching process. This in turn reduces negative etch biasing caused by lateral erosion of the bilayer photoresist features. Once these modifications have been completed, the bilayer photoresist structure is lifted off by dissolving, the organic planarizing layer from beneath the metal oxide mask. The device substrate is then ready for another processing cycle.

When used to deposit permanent metal oxide device features, the photoresist is applied onto the device substrate, patterned, and then heated in air to form an metal oxide layer. The metal oxide may be calcined at high temperatures (>300° C.) to obtain a densified polycrystalline structure which has physical properties more suitable for device applications.

EXAMPLES

Example 1

A photoresist composition corresponding to the present invention was prepared and used to pattern a color filter layer by a plasma etchings process.

a. Preparation of Photopolymerizable Organotitanium Polymer

Fifteen (15) parts by weight of poly(n-butyltitanate) obtained from Geleste Corporation were combined with 20 parts by weight of 2-hydroxyethyl acrylate (2-HEA) in a closed container and heated for approximately one hour to cause substitution of the titanate ester groups by 2-HEA. The resulting solution was used to prepare the photoresist composition described below.

b. Photoresist Formulation

A photoresist composition was prepared by combining 25.9 g of the above polymer solution, with 1.0 g of 2-isopropyl-9H-thioxanthen-9-one, and 3.0 g octyl p-dimethylaminobenzoate in 70.1 g propylene glycol methyl ether to form a solution containing 29.9 wt. % total solids.

c. Patterning Trials on Silicon

The photoresist composition was spin coated onto silicon wafers at 3000 rpm for 60 sec and then dried at 100° C. for 60 see on a hot plate to obtain 1600 Å-thick film specimens. The coated specimens were exposed to a broadband ultraviolet light source through a contact mask to form a latent negative image in the photoresist film. An exposure dose of 100 mJ/cm$^2$ was applied. The exposed specimens were developed for 5–10 seconds in 0.26 N tetramethylammonium hydroxide solution to form sharply defined, isolated, and dense features as small as 1 micron in width. The smallest features were retained at all points across the substrate, indicating that the photoresist had excellent adhesion to the silicon substrate.

Patterned specimens were placed individually in a March plasma etclhilng system and exposed to an oxygen-rich plasma for periods ranging from 1–60 minutes. Comparison of film thickness before and after exposure to the plasma showed that the starting film thickness of 1600 Å quickly decreased to 1100 Å, after which no further change was observed regardless of the etching time. The results clearly indicated that the organic components of the photoresist were rapidly removed by the oxygen plasma, leaving a titania layer which resisted further etching.

d. Pattern Transfer into an Organic Color Layer

The patterning process with the photoresist composition was repeated with the photoresist film now applied onto a substrate which had been previously coated with a 1.5 micron-thick polyimide color filter containing solvent-soluble organic dyes. (The color filter was baked at 230° C. for 1 hour prior to applying the photoresist.) Microscopic inspection of the photoresist layer immediately after patterning showed that two-micron and larger-sized features were retained across the substrate during the development process. The specimen was placed in a March plasma etching system and exposed to a plasma comprised of 90% $O_2$ and 10% $CF_4$. After a 10-minute etch, the color filter was cleanly removed from those areas not protected by the photoresist. The photoresist remained uniformly intact on the color features at all points on the specimen.

Example 2

A photoresist composition corresponding to the present invention was prepared from an organotitanium polymer formed by the reaction of poly(n-butyltitanate) and an addition photopolymerizable beta-ketoester. The polymer showed improved solution stability in comparison to the organotitanium polymer used in Example 1.

a. Preparation of Photopolymerizable Organotitanium Polymer

In a 250 ml, oven-dried, round bottom flask fitted with a drying tube 29.67 g of poly(n-butyltitanate), containing a calculated 0.282 moles of reactive n-butyl ester groups, were combined with 66.32 g of 2-methacryloxyethyl acetoacetate (MEAA). The solution was stirred at room temperature for about 20 minutes and then immersed in an oil bath for 24 hours at 70–80° C. to cause substitution of the titanate ester groups by MEAA. Thie resulting polymer solution was used to prepare the photoresist composition described in section (b) below.

A second preparation of the same polymer was placed in a 50° C. oven for two weeks to determine its stability against gellation. The gold-yellow polymer solution exhibited a kinematic viscosity of 19.62 Centistokes at the beginning of the period. After two weeks at 50° C. the color of the solution was unchanged and its viscosity had decreased to 18.18 Centistokes (−7.3%), indicating the solution possessed excellent stability. When a solution of the photopolymerizable organotitanium polymer used in Example 1 was aged similarly, it gelled within 24 hours.

b. Photoresist Formulation

A photoresist composition was prepared by combining 26.0 g of the above polymer solution, 1.0 g of 2-isopropyl-9H-thioxanthen-9-one, and 3.0 g octyl p-dimethylaminiobenzoate in 74.1 g propylene glycol methyl ether. The solution was stirred for 1 hr at room temperature and then passed through a 0.2 μm endpoint filter to remove particulates prior to spin coating.

c. Patterning Trails on Silicon

The photoresist composition was spin coated onto silicon wafers at 3000 rpm for 60 sec and then dried at 100° C. for 60 sec on a hot plate to obtain 1500 Å-thick film specimens. The coated specimenis were exposed to a broadband ultraviolet light source through a contact mask to form a latent negative image in the photoresist film. An exposure dose of approximately 300 mJ/cm$^2$ was applied. The exposed specimens were developed for about 5 minutes in dilute potassium carbonate solution to form sharply defined, isolated, and dense features as small as 1 micron in width. The smallest features were retained at all points across the substrate, indicating that the photoresist had excellent adhesion to the silicon substrate.

d. Testing of Plasma Etching Resistance

The ability of the photoresists to withstand plasma etching in 90% $O_2$/10% $CF_4$ was evaluated after applying various heat treatments (bakes) to the photoresists. It was expected that plasma etching resistance would improve as baking temperature and/or time increased since more of the easily etchable carbonaceous material would be removed from the photoresist layer prior to plasma etching by the heat treatment. The resistance of the photoresist to plasma etching in pure oxygen was determined at the same time. The results of the evaluations are summarized in Table 1.

The data in Table 1 indicated that the film thickness of the photoresist layer was highly dependent on the bake process applied to the layer prior to plasma etching. As bake temperature and time increased, more of the carbonaceous components were outgassed from the film, causing pre-etch film thickness to progressively decrease. Heat treatment of the photoresist layer improved resistance to $O_2$/$CF_4$ etching as evidenced by the fact that post-etch photoresist thickness increased as bake temperature and time increased. The photoresist layer was highly resistant to plasma etching in pure oxygen regardless of the manner of heat treatment.

What is claimed is:

1. A plasma etch-resistant photoresist composition comprised of:
    (a) an organotitanium polymer or organotitanium copolymer produced by reacting:
        a poly(alkyltitanate) or a poly(alkyltitanate-co-alkylmetallate) or mixtures thereof wherein the alkyl groups of the poly(alkyltitanate) or poly (alkyltitanate-co-alkylmetallate) are bonded to respective oxygen atoms which are bonded to the titanium atom of the poly(alkyltitanate) or poly (alkyltitanate-co-alkylmetallate), with
        addition polymerizable beta-diketones, beta-ketoesters, alpha-hydroxy carboxylic acid salts, alpha-hydroxy carboxylic acid esters or mixtures thereof; and
    (b) a solvent vehicle suitable for obtaining high quality thin films on device substrates by spin casting.

2. The plasma etch-resistant photoresist composition of claim 1 is further comprised of an addition polymerizable co-monomer having at least one ethylenically unsaturated double bond.

3. The plasma etch-resistant photoresist composition of claims 1 or 2 wherein the composition is further comprised of a soluble metallic compound which is stable in the photoresist composition.

4. The plasma etch-resistant photoresist composition of claim 3 wherein the soluble metallic compound is selected from the group consisting of soluble metal carboxylates, metal alkoxides, metal hydroxides, metal organo chelates, metal chlorides, and metal nitrates.

5. The plasma etch-resistant photoresist composition of claim 2 wherein the co-monomer is selected from the group of mono- and polyfunctional (meth)acrylate esters consisting of 2-hydroxyethyl (meth)acrylate; ethylene glycol dimethacrylate, pentaerythritol triacrylate and tetraacrylate; dipentaerythritol pentaacrylate and hexaacrylate; polyester (meth)acrylates obtained by reacting (meth)acrylate acid with polyester prepolymers; urethane (meth)acrylates; epoxy (meth)acrylates prepared by reacting (meth)acrylic acid with epoxy resins such as bisphenol-A epoxy resins, bisphenol-F epoxy resins, and novolak epoxy resins; and tris(2-acryloyloxyethyl) isocyanurate.

6. The plasma etch-resistant photoresist composition of claim 2 wherein the co-monomers are selected from acrylic-functional metal complexes prepared by transesterifying titanium or zirconium alkoxides with 2-hydroxyethyl acrylate or a chelating organic moiety having at least one ethylenically unsaturated double bond.

7. The plasma etch-resistant photoresist composition of claim 1 wherein the copolymerized alkylmetallate is selected from the group consisting of —(RO)Al—O—, —(RO)$_2$Zr—O—, —(R')$_2$Si—O—, and —(RO)$_2$Si—O—, wherein R and R' are monovalent organic radicals.

8. The plasma etch-resistant photoresist composition of claim 1 wherein the organotitanium polymer is produced by reacting poly(n-butyltitanate) and 2-acetoacetoxyethyl (meth)acrylate, said polymer or copolymer having the formula;

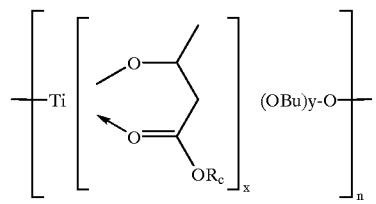

wherein $R_c$ equals —$CH_2$—$CH_2$—O—CO—C($CH_3$)=$CH_2$, Bu equals —$CH_2$—$CH_2$—$CH_2$—$CH_3$, x+y=2, x equals 0.1 to 2.0, and n>2.

9. The plasma etch-resistant photoresist composition of claim 1 wherein the organotitanium polymer is the reaction product of a poly(alkyltitanate) and a titanium chelant which has been functionalized to enable addition polymerization.

10. The plasma etch-resistant photoresist composition of claim 1 wherein the organotitanium polymer is produced by reacting poly(n-butyltitanate) and an alpha-hydroxy carboxylic acid salt, said polymer or copolymer having the formula:

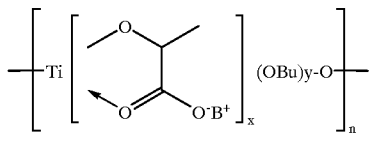

where $B^+$ equals $-(H_3C)_2NH^+-R-COCA=CH_2$, R equals $-CH_2-CH_2-CH_2-NH-$ or $-CH_2-CH_2-O-$, Bu equals $-CH_2CH_2CH_2CH_3$, $x+y=2$, x is between 0.1 to 2.0, A equals $-H$ or $-CH_3$, and $n>2$.

11. The plasma etch-resistant photoresist composition of claim 1 wherein the organotitanium polymer is the reaction product of a titanate orthoester having at least one ethylenically unsaturated double bond and a limited amount of water to form a soluble polymeric condensation product.

12. The plasma etch-resistant photoresist composition of claim 1 wherein the organotitanium polymer is produced by reacting copolymers of alkytitanates and alkylsilicates and other alkylmetallates having metals selected from the group consisting of aluminum, zirconium, cerium, niobium, and tantalum.

13. The plasma etch-resistant photoresist composition of claim 1 wherein the photoresist composition is further comprised of materials to enhance color, with the material being selected from the group consisting of solvent-soluble dyes and pigments.

14. The plasma etch-resistant photoresist composition of claim 1 wherein the solvent is selected from the group consisting of: alcohols, esters, glymes, ethers, glycol ethers, ketones, and combinations thereof.

15. The plasma etch-resistant photoresist composition of claim 1 wherein exposure to a high energy source will crosslink the organotitanium polymer or copolymer by inducing addition polymerization.

16. The plasma etch-resistant photoresist composition of claim 15 wherein the high energy source is selected from the group consisting of an electron beam, an x-ray source, and combinations thereof.

17. The plasma etch-resistant composition of claim 1 wherein the composition further comprises a free radical-generating photopolymerization initiator or initiator system.

18. The plasma etch-resistant photoresist composition of claim 17 wherein the free radical initiator or initiator system operates effective 200–500 nm exposure wavelenghts.

19. An organotitanium polymer capable of addition polymerization, wherein the organotitanium polymer is selected from the group consisting of:

(a)

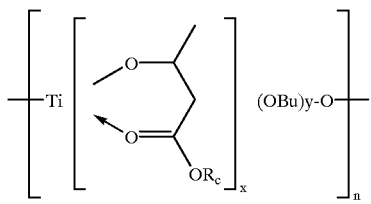

where $R_c$ equals $-CH_2CH_2OCOC(CH_3)=CH_2$, Bu equals $-CH_2CH_2CH_2CH_3$, $x+y=2$, x is between 0.1 and 2.0, and $n>2$; and (b)

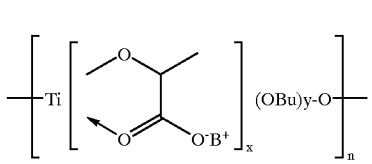

where $B^+$ equals $-(H_3C)_2NH^+-R-COCA=CH_2$, R equals $-CH_2-CH_2-CH_2-NH-$ or $-CH_2-CH_2-O-$, Bu equals $-CH_2CH_2CH_2CH_3$, $x+y=2$, x is between 0.1 and 2.0, A equals $-H$ or $-CH_3$, and $n>2$.

20. A method for forming an organotitanium polymer capable of addition polymerization, wherein the method is comprised of: reacting a titanium polymer or copolymer selected from the group consisting of poly(alkyltitanates) and poly(alkyltitanates-co-alkylmetallates) with a compound selected from the group consisting of addition polymerizable beta-diketones, beta-ketoesters, alpha-hydroxy carboxylic acid salts, and alpha-hydroxy carboxylic acid esters, wherein the alkyl groups of the poly(alkyltitanate) or poly(alkyltitanate-co-alkylmetallate) are bonded to respective oxygen atoms which are bonded to the titanium atom of the poly(alkyltitanate) or poly(alkyltitanate-co-alkylmetallate).

21. An organotitanium polymer capable of addition polymerization, wherein the organotitanium polymer is the reaction product of:
   (a) a titanium polymer or copolymer selected from the group consisting of poly(alkyltitanates) and poly(alkyltitanates-co-alkylmetallates), wherein the alkyl groups of the poly(alkyltitanate) or poly(alkyltitanate-co-alkylmetallate) are bonded to respective oxygen atoms which are bonded to the titanium atom of the poly(alkyltitanate) or poly(alkyltitanate-co-alkylmetallate; and
   (b) a compound selected from the group consisting of addition polymerizable beta-diketones, beta-ketoesters, alpha-hydroxy carboxylic acid salts, and alpha-hydroxy carboxylic acid esters.

22. A dried photoresist composition on a substrate, wherein the photoresist composition is comprised of:
   (a) an addition polymerizable organotitanium polymer added in an amount equal to between about 15% by weight and about 90% by weight of the photoresist composition, said polymer being produced by reacting:
      a poly(alkyltitanate) or a poly(alkyltitanate-co-alkylmetallate) or mixtures thereof wherein the alkyl groups of the poly(alkyltitanate) or poly(alkyltitanate-co-alkylmetallate) are bonded to respective oxygen atoms which are bonded to the titanium atom of the poly(alkyltitanate) or poly(alkyltitanate-co-alkylmetallate), with
      addition polymerizable beta-diketones, beta-ketoesters, alpha-hydroxy carboxylic acid salts, alpha-hydroxy carboxylic acid, esters or mixtures thereof; and
   (b) a photopolymerization initiator that operates at 200–500 nm added in an amount equal to between about 1% and about 20% by weight of the photoresist composition.

23. The photoresist composition of claim 22 wherein the addition polymerizable organotitanium polymer is added in an amount equal to between about 40% and about 80% by weight of the photoresist composition.

24. The photoresist composition of claim 22 wherein the photopolymerization initiator is added in an amount equal to between about 10% and about 15% by weight of the photoresist composition.

25. The photoresist composition of claim 22 wherein the addition polymerizable organotitanium polymer is selected from the group consisting of:

(a)
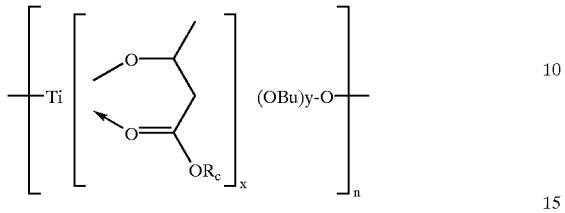

where $R_c$ equals $-CH_2CH_2OCOC(CH_3)\!=\!CH_2$, Bu equals $-CH_2CH_2CH_2CH_3$, x+y=2, x is between 0.1 and 2.0, and n>2; and, (b)
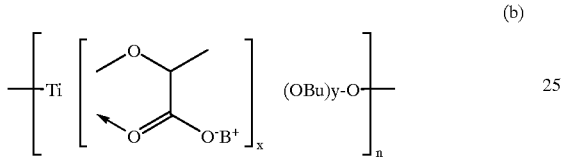

where $B^+$ equals $-(H_3C)_2NH^+CH_2CH_2OCOCA\!=\!CH_2$, Bu equals $-CH_2CH_2CH_2CH_3$, x+y=2, x is between 0.1 and 2.0, A equals $-H$ or $-CH_3$, and n>2.

26. The photoresist composition of claim 22 wherein the photopolymerization initiator is selected from the group consisting of: trihalomethyl-substituted triazines, trihalomethyl-substituted oxadiazoles, imidazoles, hexaaryl biimidazoles, benzoin alkyl ethers, anthraquinones, benzanthrones, benzophenones, acetophenones, thioxanthones, benzoic acid esters, acridines, phenazines, titanium compounds, and mixtures thereof.

27. The photoresist composition of claim 22 wherein the photoresist composition includes a co-monomer added in an amount equal to between about 0 and about 80% by weight of the photoresist composition, with the co-monomer selected from the group consisting of: mono- and polyfunctional (meth)acrylate esters, ethylene glycol dimethacrylate, pentaerythritol triacrylate, tetraacrylate, dipentaerythritol pentaacrylate and hexaacrylate; polyester (meth)acrylates obtained by reacting (meth)acrylate acid with polyester prepolymers, urethane (meth)acrylates, epoxy (meth) acrylates prepared by reacting (meth)acrylic acid with epoxy resins such as bisphenol-A epoxy resins, bisphenol-F epoxy resins, and novolak epoxy resins, and tris(2-acryloyloxyethyl) isocyanurate.

28. The photoresist composition of claim 27 wherein the co-monomer is added in an amount equal to between about 0 and about 50% by weight of the photoresist composition.

29. The photoresist composition of claim 22 wherein the photoresist composition includes a non-photopolymerizable metallic compound added in an amount equal to between about 0 and about 60% by weight of the photoresist composition, with the metallic compound selected from the group consisting of: metal carboxylates, metal alkoxides, metal hydroxides, metal organo chelates, and metal salts.

30. The photoresist composition of claim 29 wherein the non-photopolymerizable metallic compound is added in an amount equal to between about 0 and about 40% by weight of the photoresist composition.

31. A method for preparing a photoresist composition, wherein the method is comprised of:
(a) stirring in a solvent solution an addition polymerizable organotitanium polymer and a photopolymerization initiator, said polymer being produced by reacting:
a poly(alkyltitanate) or a poly(alkyltitanate-co-alkylmetallate) or mixtures thereof wherein the alkyl groups of the poly(alkyltitanate) or poly (alkyltitanate-co-alkylmetallate) are bonded to respective oxygen atoms which are bonded to the titanium atom of the poly(alkyltitanate) or poly (alkyltitanate-co-alkylmetallate), with
addition polymerizable beta-diketones, beta-ketoesters, alpha-hydroxy carboxylic acid salts, alpha-hydroxy carboxylic acid, esters or mixtures thereof; and
(b) diluting the composition of step (a) with additional solvent to achieve a total solids level of about 30% by weight, thereby forming the photoresist composition.

32. The method of claim 31 wherein the solution is selected from the group consisting of: alcohols esters, glymes, ethers, glycol ethers, ketones, and combinations thereof.

33. The method of claim 31 wherein a co-monomer is added to the photoresist composition.

34. The method of claim 31 wherein a non-addition polymerizable metallic composition is added to the photoresist composition.

35. A microelectronic device structure comprising a plasma etch resistant, titanium-containing photoresist layer coated on a substrate wherein the photoresist layer has a film thickness ranging between about 0.05 microns and about 1.00 microns, with the microelectronic device structure comprised of:
(a) the substrate selected from the group consisting of ceramic, metal, polymer, and semiconductor substrates; and
(b) the photoresist layer, with the photoresist layer comprised of an addition polymerizable organotitanium polymer added in an amount equal to between about 15% by weight and about 90% by weight of the photoresist composition and a photopolymerization initiator that operates at 200–500 nm added in an amount equal to between about 1% and about 20% by weight of the photoresist composition, said polymer being produced by reacting:
a poly(alkyltitanate) or a poly(alkyltitanate-co-alkylmetallate) or mixtures thereof wherein the alkyl groups of the poly(alkyltitanate) or poly (alkyltitanate-co-alkylmetallate) are bonded to respective oxygen atoms which are bonded to the titanium atom of the poly(alkyltitanate) or poly (alkyltitanate-co-alkylmetallate), with
addition polymerizable beta-diketones, beta-ketoesters, alpha-hydroxy carboxylic acid salts, alpha-hydroxy carboxylic acid esters or mixtures thereof.

36. A method for forming a microelectronic device structure having a titanium containing metal oxide layer, comprised of:
(a) selecting a substrate material selected from the group consisting of ceramic, metal, polymer, and semiconductor substrates;
(b) applying a photoresist composition comprised of a photopolymerizable organotitanium polymer to the substrate by spin coating the photoresist composition onto the substrate at a speed ranging between 500 and 5000 rpm for a time equal to between about 30 seconds and 90 seconds, so that the photoresist is present on the substrate at a thickness equal to between about 0.05 microns and about 1.00 microns, thereby forming a photoresist coated substrate;

(c) exposing the photoresist coated substrate to ultraviolet radiation passing through a mask, wherein the ultraviolet radiation is equal to between about 10 mJ/cm$^2$ and about 1000 mJ/cm$^2$ to form an exposed photoresist coated substrate;

(d) developing the exposed photoresist coated substrate in a solution selected from the group consisting of an aqueous alkali solution and an aqueous chelant solution to form a patterned photoresist; and, (e) converting the patterned photoresist to an etch resistant metal oxide layer on the substrate by heating, thereby forming the microelectronic device structure.

37. The method of claim 36 wherein step (e) is achieved by baking the patterned photoresist in air at a temperature ranging between about 150° C. and about 300° C. for a time period ranging between about 15 minutes and about 60 minutes so as to decompose organic components and leave an inorganic layer that is etch resistant.

38. A plasma etch-resistant photoresist composition comprised of:

(a) an organotitanium polymer or copolymer produced by reacting:
a poly(alkyltitanate) or a poly(alkyltitanate-co-alkylmetallate) or mixtures thereof, with
addition polymerizable alcohols, carboxylic acids, beta-diketones, beta-ketoesters, or alpha-hydroxy carboxylic acids, alpha-hydroxy carboxylic acid salts, alpha-hydroxy carboxylic esters, or mixtures thereof, said polymer comprising an addition polymerizable co-monomer having at least one ethylenically unsaturated double bond;

(b) a free radical-generating photopolymerization initiator or initiator system; and, (c) a solvent vehicle suitable for obtaining high quality thin films on device substrates by spin casting.

39. The plasma etch-resistant photoresist composition of claim 38 wherein the composition is further comprised of a soluble metallic compound which is stable in the photoresist composition.

40. The plasma etch-resistant photoresist composition of claim 38 wherein the comonomer is selected from the group consisting of mono- and polyfunctional (meth)acrylate esters consisting of 2-hydroxyethyl (meth)acrylate; ethylene glycol dimethacrylate, pentaerythritol triacrylate and tetraacrylate; dipentaerythritol pentaacrylate and hexaacrylate; polyester (meth)acrylates obtained by reacting (meth)acrylate acid with polyester prepolymers; urethane (meth)acrylates; epoxy (meth)acrylates prepared by reacting (meth)acrylic acid with epoxy resins such as bisphenol-A epoxy resins, bisphenol-F epoxy resins, and novolak epoxy resins; and tris(2-acryloyloxyethyl) isocyanurate.

41. The plasma etch-resistant photoresist composition of claim 38 wherein the comonomers are selected from the group consisting of acrylic-functional metal complexes prepared by transesterifying titanium or zirconium alkoxides with 2-hydroxyethyl acrylate or a chelating organic moiety having at least one ethylenically unsaturated double bond.

42. The plasma etch-resistant photoresist composition of claim 41 wherein the soluble metallic compound is selected from the group consisting of soluble metal carboxylates, metal alkoxides, metal hydroxides, metal organo chelates, metal chlorides, and metal nitrates.

43. A plasma etch-resistant photoresist composition comprised of:

(a) an organotitanium polymer or copolymer produced by reacting alkyltitanates and alkylsilicates and other alkylmetallates having metal selected from the group consisting of aluminum, zirconium, cerium, niobium, and tantalium;

(b) a free radical-generating photopolymerizable initiator or initiator system; and (c) a solvent vehicle suitable for obtaining high quality thin films on device substrates by spin-casting.

44. A plasma etch-resistant photoresist composition comprised of:

(a) an organotitanium polymer or copolymer produced by reacting poly(n-butyltitanate) and 2-acetoacetoxyethyl (meth)acrylate, said polymer or copolymer having the formula:

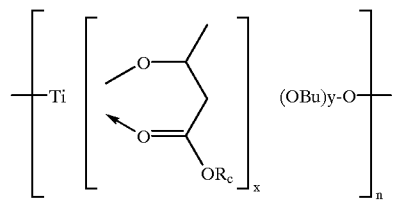

wherein $R_c$ equals —CH$_2$—CH$_2$—O—CO—C (CH$_3$)=CH$_2$, Bu equals —CH$_2$—CH$_2$—CH$_2$—CH$_3$, x+y=2, x equals 0.1 to 2.0, and n>2.

45. A plasma etch-resistant photoresist composition comprised of:

(a) an organotitanium polymer or copolymer produced by reacting a poly(alkyltitanate) and titanium chelant which has been functionalized to enable addition polymerization;

(b) a free radical-generating photopolymerizable initiator or initiator system; and (c) a solvent vehicle suitable for obtaining high quality thin films on device substrates by spin-casting.

46. A plasma etch-resistant photoresist composition comprised of:

(a) an organotitanium polymer or copolymer produced reacting poly(n-butyltitanate) and an alpha-hydroxycarboxylic acid salt, said polymer or copolymer having the formula:

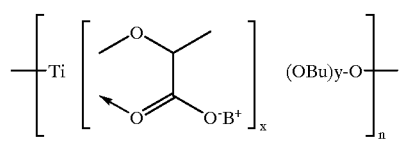

where B$^+$ equals (H$_3$C)$_2$NH$^+$—R—COCA=CH$_2$, R equals —CH$_2$—CH$_2$—CH$_2$—NH— or —CH$_2$—CH$_2$—O—, Bu equals —CH$_2$CH$_2$CH$_2$CH$_3$, x+y=2, x is between 0.1 to 2.0, A equals —H or —CH$_3$, and n>2;

(b) a free radical-generating photopolymerizable initiator or initiator system; and (c) a solvent vehicle suitable for obtaining high quality thin films on device substrates by spin-casting.

47. A method for preparing a photoresist composition, wherein the method is comprised of:
   (a) stirring in a solvent solution an addition polymerizable organotitanium polymer, a photopolymerization initiator, and a co-monomer; and
   (b) diluting the composition of step (a) with additional solvent to achieve a total solids level of about 30% by weight, thereby forming the photoresist composition.

48. A method for preparing a photoresist composition, wherein the method is comprised of:
   (a) stirring in a solvent solution an addition polymerizable organotitanium polymer, a photopolymerization initiator, and a non-addition polymerizable metallic composition; and
   (b) diluting the composition of step (a) with additional solvent to achieve a total solids level of about 30% by weight, thereby forming the photoresist composition.

* * * * *